(12) United States Patent
Rafferty et al.

(10) Patent No.: US 8,766,393 B2
(45) Date of Patent: Jul. 1, 2014

(54) LOW-NOISE SEMICONDUCTOR PHOTODETECTORS

(75) Inventors: Conor S. Rafferty, Newton, MA (US); Clifford A. King, Gloucester, MA (US)

(73) Assignee: Infrared Newco, Inc., Tucson, AZ (US)

( * ) Notice: Subject to any disclaimer, the term of this patent is extended or adjusted under 35 U.S.C. 154(b) by 26 days.

(21) Appl. No.: 13/230,715

(22) Filed: Sep. 12, 2011

(65) Prior Publication Data
US 2012/0025082 A1     Feb. 2, 2012

Related U.S. Application Data

(60) Division of application No. 11/978,276, filed on Oct. 29, 2007, now Pat. No. 8,035,186, which is a continuation of application No. 11/210,223, filed on Aug. 23, 2005, now Pat. No. 7,288,825.

(51) Int. Cl.
*H01L 31/00*     (2006.01)
*H01L 31/06*     (2012.01)
*H01L 31/102*   (2006.01)

(52) U.S. Cl.
USPC ........... 257/459; 257/461; 257/463; 257/465; 257/E31.011; 257/E31.032; 257/E31.038; 257/E31.039; 257/E31.093; 257/E31.125

(58) Field of Classification Search
None
See application file for complete search history.

(56) References Cited

U.S. PATENT DOCUMENTS

| | | | |
|---|---|---|---|
| 4,318,115 A | 3/1982 | Yoshikawa et al. | |
| 4,355,196 A * | 10/1982 | Chai | 136/259 |
| 5,189,297 A | 2/1993 | Ahlgren | |
| 5,212,395 A | 5/1993 | Berger et al. | |
| 5,360,987 A | 11/1994 | Shibib | |
| 5,371,033 A | 12/1994 | Lee et al. | |
| 5,467,204 A | 11/1995 | Hatano et al. | |
| 5,549,762 A | 8/1996 | Cantarini | |
| 5,880,482 A | 3/1999 | Adesida et al. | |

(Continued)

FOREIGN PATENT DOCUMENTS

| | | |
|---|---|---|
| JP | 60151940 | 8/1985 |
| JP | 62-172765 A | 7/1987 |

(Continued)

OTHER PUBLICATIONS

Office Action from Korean Application No. KR2008-7006456 dated Jan. 28, 2013, 4 pages.

(Continued)

*Primary Examiner* — Hoang-Quan Ho
(74) *Attorney, Agent, or Firm* — Wolf, Greenfield & Sacks, P.C.

(57) ABSTRACT

A photodetector is formed from a body of semiconductor material substantially surrounded by dielectric surfaces. A passivation process is applied to at least one surface to reduce the rate of carrier generation and recombination on that surface. Photocurrent is read out from at least one electrical contact, which is formed on a doped region whose surface lies entirely on a passivated surface. Unwanted leakage current from un-passivated surfaces is reduced through one of the following methods: (a) The un-passivated surface is separated from the photo-collecting contact by at least two junctions; (b) The un-passivated surface is doped to a very high level, at least equal to the conduction band or valence band density of states of the semiconductor; (c) An accumulation or inversion layer is formed on the un-passivated surface by the application of an electric field.

10 Claims, 27 Drawing Sheets

(56) References Cited

U.S. PATENT DOCUMENTS

| | | | |
|---|---|---|---|
| 5,883,421 A | | 3/1999 | Ben Chouikha et al. |
| 6,229,084 B1* | | 5/2001 | Katsu .......................... 136/255 |
| 6,403,877 B2* | | 6/2002 | Katsu .......................... 136/255 |
| 6,541,836 B2 | | 4/2003 | Iwanczyk et al. |
| 6,597,025 B2* | | 7/2003 | Lauter et al. ................. 257/258 |
| 6,606,120 B1 | | 8/2003 | Merrill et al. |
| 6,656,760 B2 | | 12/2003 | Schmitz et al. |
| 6,759,694 B1 | | 7/2004 | Hsu et al. |
| 6,846,740 B2 | | 1/2005 | Demir et al. |
| 6,995,444 B2* | | 2/2006 | Cova et al. .................... 257/438 |
| 7,683,449 B2 | | 3/2010 | Minixhofer |
| 2004/0117834 A1 | | 6/2004 | Karaoguz et al. |
| 2005/0127275 A1* | | 6/2005 | Yang ........................ 250/214 R |
| 2006/0102972 A1* | | 5/2006 | Bhattacharyya ............. 257/432 |
| 2006/0255280 A1 | | 11/2006 | Shibayama |

FOREIGN PATENT DOCUMENTS

| | | |
|---|---|---|
| JP | 394478 | 4/1991 |
| JP | 4276666 | 10/1992 |
| JP | 6045076 | 2/1994 |
| JP | 7202254 | 8/1995 |
| JP | 8-250761 A | 9/1996 |
| JP | 10-144948 A | 5/1998 |
| JP | 2004-273848 A | 9/2004 |
| JP | 2005-045125 A | 2/2005 |
| WO | WO 2005048355 A1 | 5/2005 |

OTHER PUBLICATIONS

Final Office Action from Korean Application No. KR2008-7006456 dated Aug. 25, 2013, 1 page.

Cheng et al., "An Ultra-Low Dark Current CMOS Image Sensor Cell Using n+ Ring Reset", IEEE Electron Device Letters, 23:9, pp. 538-540 (2002).

Colace et al., "Efficient High-Speed Near-Infrared Ge Photodetectors Integrated on Si Substrates," Applied Physics Letters, 76:10, 1231-1233 (2000).

GPD Germanium Photodetector Data Sheet, device GM8VHR, GPD Optoelectronics Corp., pp. 1-12.

International Search Report and Written Opinion mailed Jul. 22, 2008 for International Application No. PCT/US06/31880 (7 pages).

Judson Technologies, LLC, Germanium Photodetector Data Sheet PB1600 (2000).

Masini et al., "Highperformance p-i-n. Ge on Si photodetectors for near infrared, from model to demonstration," IEEE Trans. Electron Devices, 48:6, pp. 1092-1096 (2001).

Oh et al., "Interdigitated Ge p-i-n. photodetectors fabricated on a Si substrate using graded SiGe buffer layers," IEEE Journal of Quantum Electronics, 38:9, pp. 1238-1241 (2002).

Shang, et al., "High mobility p-channel Ge MOSFET's with a thin Ge oxynitride gate dielectric," IEDM Tech. Digest, pp. 441-444 (2002).

Office Action dated Nov. 18, 2011 in Japanese Patent Application No. 2008-527984.

* cited by examiner

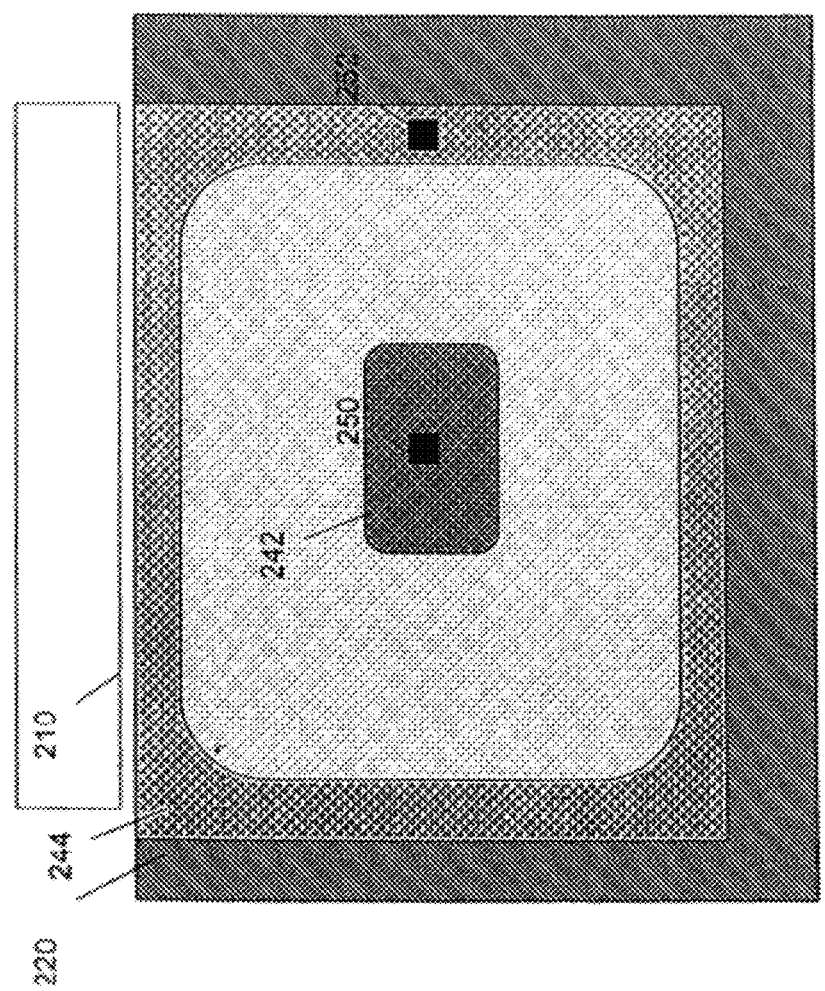

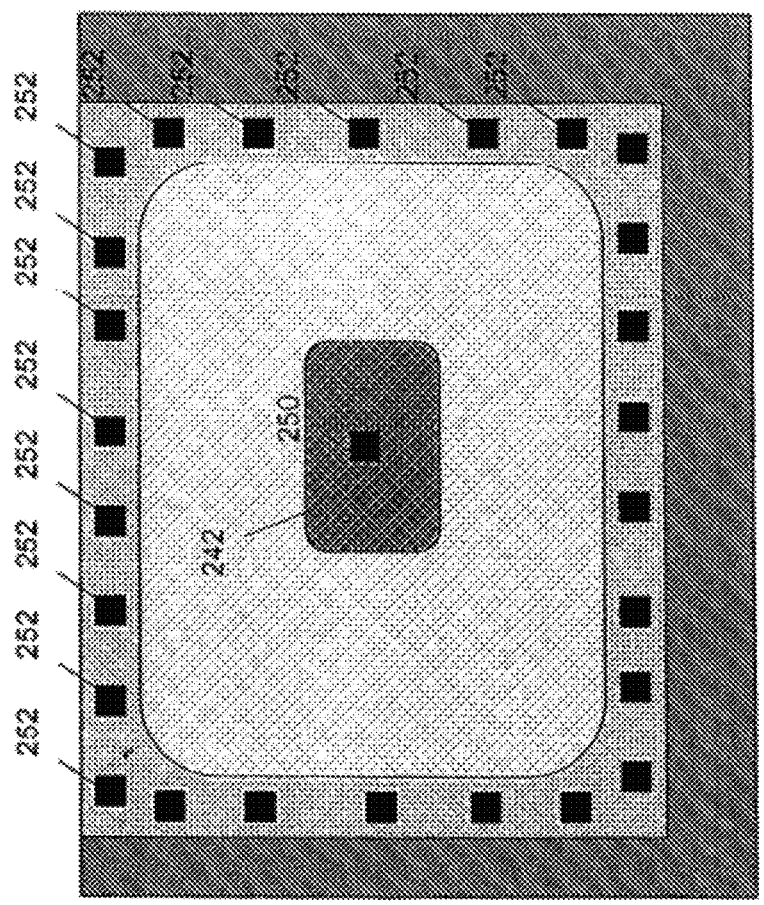
Figure 8 (prior art illustration)

LOW-NOISE SEMICONDUCTOR PHOTODETECTORS

CROSS-REFERENCE TO RELATED APPLICATIONS

This application claims the benefit as a divisional application of U.S. patent application Ser. No. 11/978,276 filed by Rafferty et al. on Oct. 29, 2007 and entitled: "Low-Noise Semiconductor Photodetectors," which is a continuation of U.S. patent application Ser. No. 11/210,223 filed by Rafferty et al. on Aug. 23, 2005 and entitled: "Low-Noise Semiconductor Photodetectors." The foregoing applications are incorporated herein by reference in their entireties.

STATEMENT OF GOVERNMENT INTEREST

The United States Government has certain rights to this invention pursuant to NSF Award DMI-0450487.

FIELD OF INVENTION

This invention relates to semiconductor photodetectors for visible and infrared light, and in particular, to low-noise semiconductor photodetectors and methods for making them.

BACKGROUND OF THE INVENTION

Semiconductor photodiodes are widely used for the detection of light, both visible and infrared. They exploit the internal photoelectric effect, where electron-hole pairs are generated in the semiconductor by photon absorption and contribute to electrical conduction inside the device, leading to a corresponding current at the contacts of the detector. Such detectors are fabricated singly, or in linear arrays for spectroscopy, or in two-dimensional (2-D) arrays for imaging.

To create highly sensitive detectors, low noise is desired. Low noise requires that all sources of leakage current in the photodiode should be suppressed to the greatest degree possible. Leakage currents in a semiconductor photodiode arise by a variety of mechanisms, including leakage at surface traps, leakage through bulk traps or defects, quantum-mechanical tunneling between the valence and conduction bands in the semiconductor, spontaneous electron-hole generation through thermal energy, impact ionization, and junction diffusion current.

Tunneling leakage can be reduced by employing moderate doping levels and low voltages. Bulk leakage can be reduced by using high-purity materials and by using growth techniques which avoid the formation of crystal defects such as stacking faults, twins, and dislocations. Spontaneous electron-hole generation and impact ionization are negligible in detectors made of an indirect bandgap material such as silicon or germanium. When all these leakage mechanisms have been reduced, surface leakage and diffusion current remain as the dominant leakage mechanisms.

Surface leakage is caused by traps at the interface between the semiconductor and any dielectric surfaces which contact it. The traps typically originate due to dangling bonds which result when the semiconductor lattice is terminated. Two types of surface leakage can be distinguished: leakage arising where a depletion region intersects a surface, and leakage where the semiconductor adjoining the interface is doped and charge-neutral. In both cases, leakage will arise whenever an electron-hole pair is generated at a trap on the surface, and the electron and hole make their way to different junctions, causing current to flow in an external circuit. Leakage at a depleted surface is proportional to the intrinsic carrier concentration and therefore depends on temperature as $\exp(-E_g/2kT)$ where $E_g$ is the semiconductor bandgap. Leakage at a doped interface varies as $\exp(-E_g/kT)$ and is typically much lower.

A semiconductor photodetector using the photoelectric effect, such as a P-N photodiode, cannot avoid having a depletion layer intersecting the semiconductor surface. The larger the depletion layer, the more surface leakage. The un-depleted surfaces will also give rise to leakage current even if some means is found to suppress leakage at the depleted surface.

Diffusion current is an intrinsic aspect of a diode and cannot be eliminated, though it can be reduced. It arises whenever voltage bias is applied to the diode. The applied voltage disturbs the minority carrier concentrations at the edge of the diode junction from their equilibrium values. The minority carrier concentrations at the contacts are always equal to their equilibrium values. Consequently there is a gradient of minority carriers between the junction and the contacts, giving rise to a steady diffusion current of minority carriers. Under reverse bias, the condition where a photodiode is normally operated, minority carriers flow from the contacts to the junction, where they are continuously swept away by the field to become majority carriers on the other side of the junction.

All these sources of leakage current compete with the photocurrent generated by incoming light, and therefore compete with the signal and reduce the signal-to-noise ratio.

Photodiodes formed in silicon exploit the highly optimized silicon/silicon dioxide surface. These surfaces, which have extremely low surface recombination velocities, are referred to as passivated surfaces. Such photodiodes are widely used in CCDs and CMOS imagers. However it is desirable to form photodetectors in other materials besides silicon, in order to form images using light of wavelengths to which silicon is not sensitive, e.g., infrared light.

Germanium is one material which can be used to form infrared-sensitive photodiodes. Germanium photodiodes have been reported to have undesirably high dark current for many applications. Reported leakage current densities for germanium diodes grown on silicon are of order 1 mA/cm$^2$. See references designated [1][2] in the attached Appendix. This is approximately equal to the photocurrent that would be generated by bright sunlight, and represents a high level of leakage. Germanium photodiodes formed in bulk germanium have reported leakage 10-100 times lower [3][4], but this is still not sufficient for imaging indoors or in twilight conditions. To form low leakage detectors, improved devices and processes are needed.

SUMMARY OF THE INVENTION

In accordance with the invention, a low noise photodetector comprises a body of semiconductor material substantially surrounded by dielectric material. A portion of the body surface is passivated by a high quality dielectric and a portion is unpassivated. The semiconductor body includes a p-n junction for operation as a photodetector to minimize leakage, the p-n junction (including its depletion region) intersects the semiconductor surface within the passivated portion of the surface, and leakage from the unpassivated surface is minimized by one or more of the following: 1) the body includes opposite polarity p-n junctions (n-p and p-n) in the electrical path between the surface and the photocurrent collector, 2) the body includes a highly doped region in contact with the dielectric, 3) a doped semiconductor outside a thin dielectric provides a charge accumulation region adjacent the interface.

BRIEF DESCRIPTION OF THE SEVERAL VIEWS OF THE DRAWINGS

The nature, advantages and various additional features of the invention will appear more fully upon consideration of the illustrative embodiments now to be described in connection with the accompanying drawings:

FIGS. 3a and 3b show a cross-section and plan view respectively of a second embodiment of a low noise photodiode.

FIG. 8, which is prior art, shows a conventional contacting scheme for a photodiode useful in understanding an advantageous additional feature of the invention.

It is to be understood that these drawings are for illustration of the concepts of the invention and are not to scale.

DETAILED DESCRIPTION

Figure 1A:
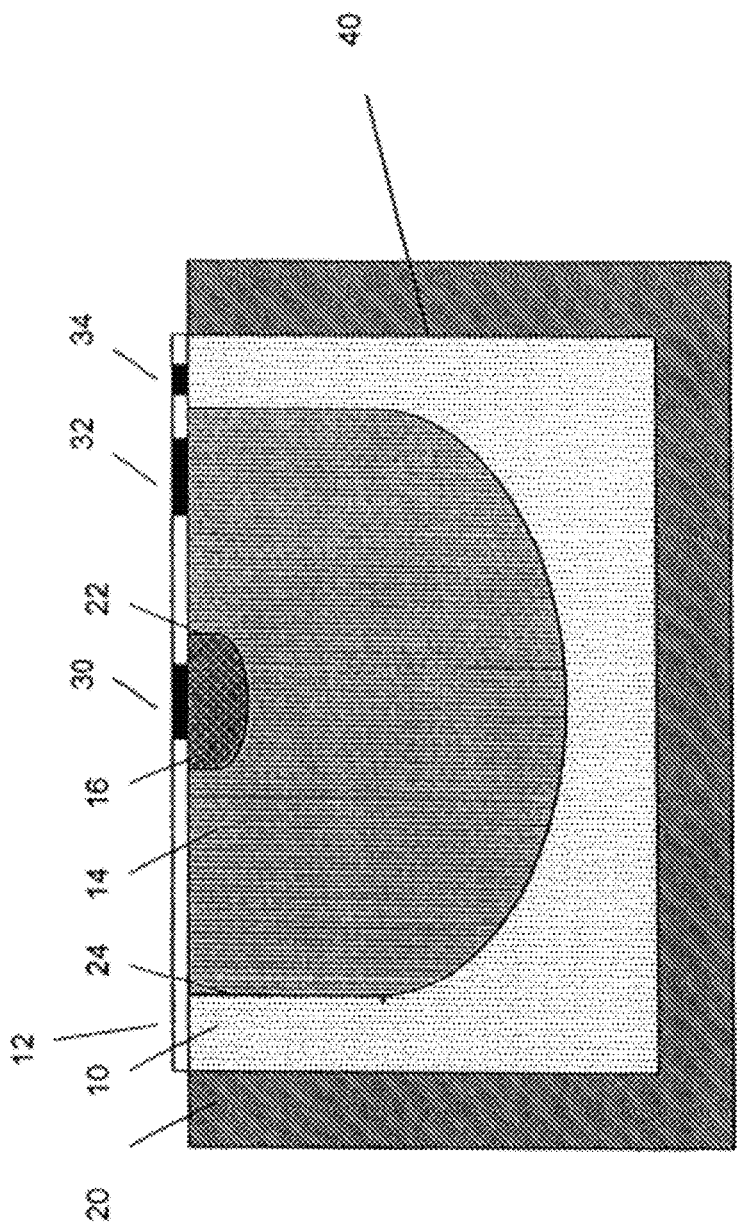
FIG. 1a is a cross sectional view of a first embodiment of a low noise photodiode according to the invention.

FIGS. 1a (cross-section) and 1b (plan-view) illustrate a low noise semiconductor photodetector. The semiconductor body 10 is substantially surrounded by dielectric material or materials. A first portion of the semiconductor surface is passivated, and a second portion is unpassivated. Here a high-quality dielectric 12 with a low surface recombination velocity is formed on the top surface of the semiconductor body 10 to passivate the top surface. The body is peripherally surrounded by low quality dielectric 20 that does not passivate the peripheral surface. The semiconductor body 10 is doped p-type. An n-type area 14 is formed in the body, peripherally enclosed by the p-type layer and forming a junction 24 between the n-type and p-type layer. A second p-type layer 16 is formed in the n-type layer 14, peripherally enclosed by the n-type layer and forming a junction 22 between the inner p-type and n-type layers (16,14). Ohmic metal contacts 30, 32, and 34 are formed to all the doped semiconductor layers (16, 14, and 10). Photocurrent is detected on contact 30, which is biased relative to contact 32 so that a reverse bias exists on the junction 22. Bias is applied to contact 34 so that either zero or reverse bias exists across the junction 24.

The p-n junctions 22, 24 including their respective depletion regions intersect the surface of the body 10 in respective intersection regions 22A, 24A. Leakage is minimized by keeping these intersection regions within the passivated portion of the semiconductor surface.

Moreover, in this embodiment, any carrier generated at the interior unpassivated dielectric surfaces 40 must cross two junctions of opposite polarity (p to n and n to p) in order to reach region 16 and the contact 30. If the carrier is a hole, it will preferentially stay in the p-type layer 10 and be collected at contact 34. If it is an electron, it will enter the n-type layer 14 and will then preferentially stay there, to be collected at contact 32. Thus both types of carriers generated at the unpassivated surface will be prevented from reaching the photo-collecting contact 30.

A further optimization of the structure to improve the quantum efficiency is to grade the middle doped layer (n-type in this example) so that the doping is lower near the center of the well and higher near the edge. This creates a barrier for photocarriers generated in the n-type region so that the photogenerated holes from the n-region 14 will preferentially be collected at the center "p" contact 30 rather than at the perimeter "p" contact 34. Such a graded doping profile is likely to arise naturally if the doping is created by ion implantation, but the effect can be enhanced by judicious choice of implant energy and dose.

Although the device has been described as p-n-p, it should be appreciated that a corresponding n-p-n implementation is equally practical by appropriate choice of doping.

Figure 1B:
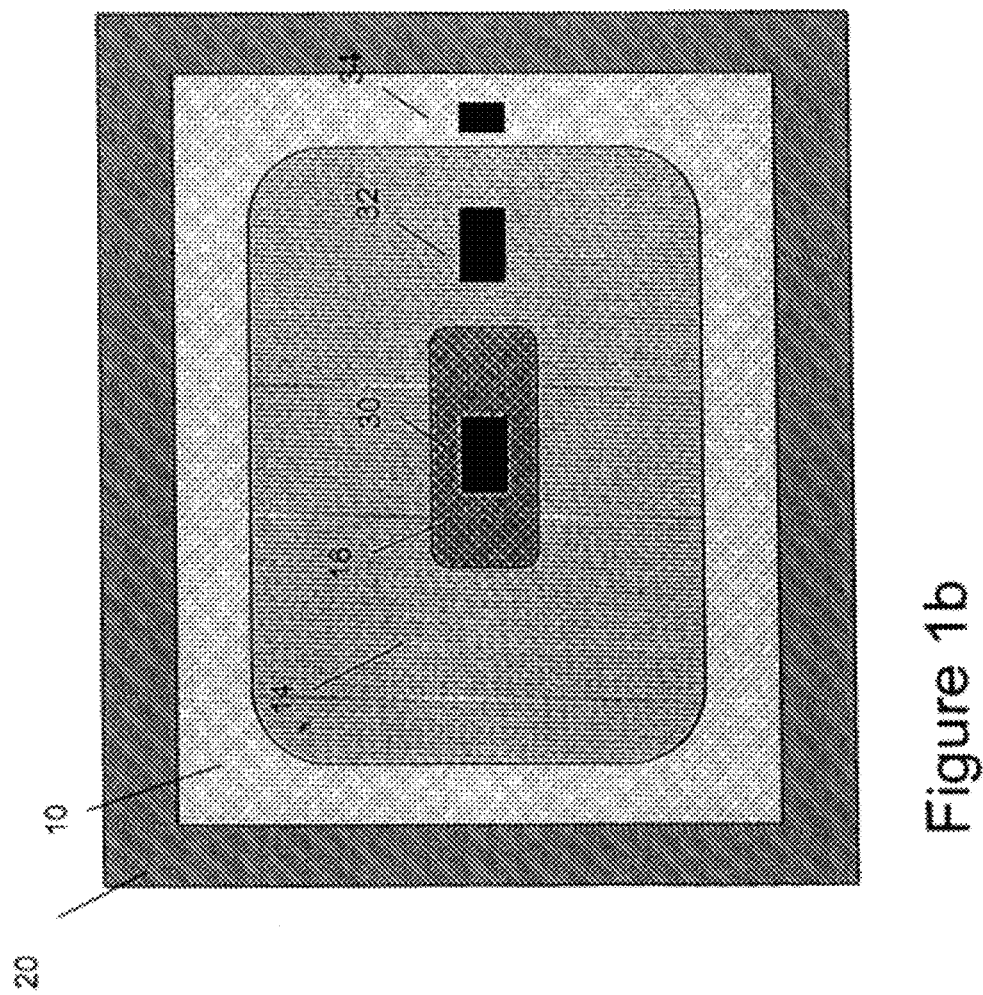
FIG. 1b shows a plan view of the FIG. 1b photodiode.
Figure 2A:
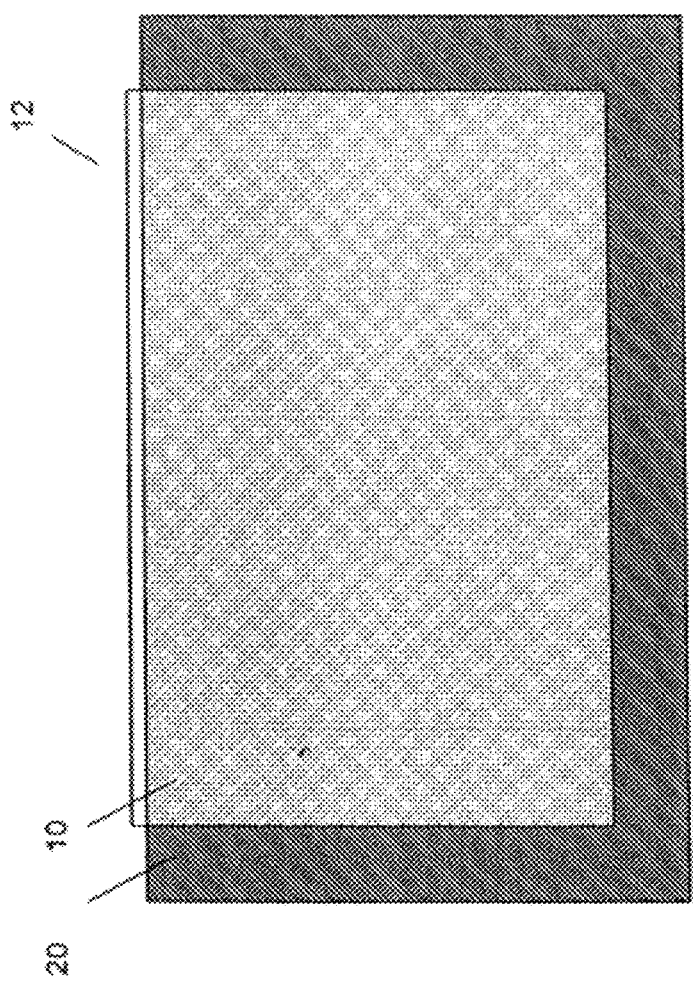
FIGS. 2a, 2b and 2c show a process sequence to create the photodiode of FIGS. 1a and 1b.
Figure 2B:
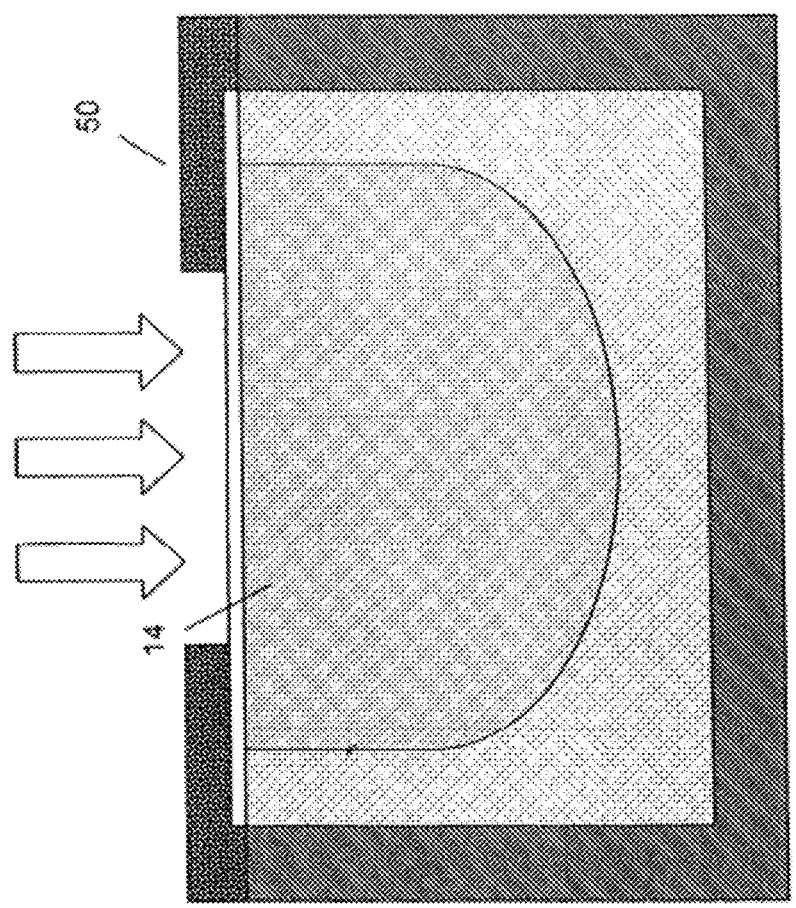
Figure 2C:
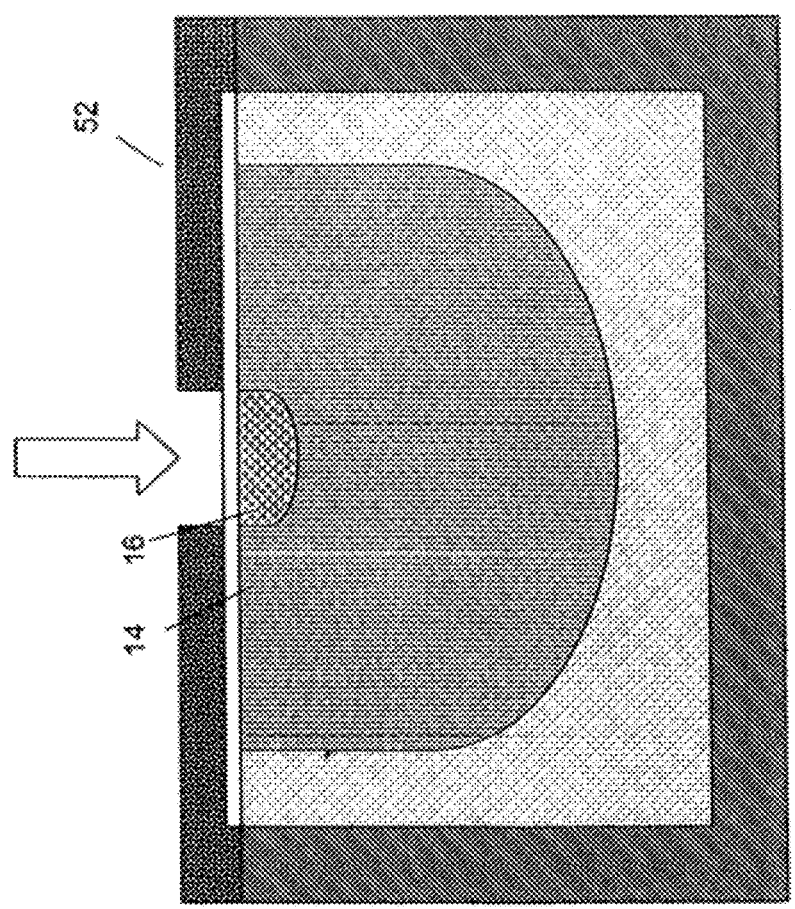

A process sequence to create the FIG. 1 device is illustrated by FIGS. 2a, 2b, and 2c. A semiconductor body 10 is formed within a cavity inside a dielectric layer 20, for instance by the technique disclosed in U.S. patent application Ser. No. 10/453,037 filed by J. Bude et al. on Jun. 3, 2003 and entitled "Semiconductor Devices with Reduced Active Region Defects and Unique Contacting Schemes" which is incorporated herein by reference. The '037 application claims the benefit of U.S. Provisional Application Ser. No. 60/434,359, filed by J. Bude et al. on Dec. 18, 2002, and this provisional application is also incorporated herein by reference. A passivation process is then applied to the top surface of the semiconductor 10 to create a high-quality dielectric layer 12. Such methods are known to those skilled in the state of the art. For silicon, passivation can be achieved by growing a high quality silicon oxide dielectric on the surface. For germanium, a highly passivated surface can be created using germanium oxynitride, as demonstrated in reference [5].

Referring to FIG. 2b, photoresist 50 is then applied to the wafer and an opening is formed above the semiconductor body. N-type ions, such as, phosphorus or arsenic, are implanted to form the n-type layer 14. If a strongly graded profile is desired, as described above, a series of chained implants can be used, combining high dose, high energy and lower dose, lower energy implants. The first level of photoresist is then removed.

As shown in FIG. 2c, a second level of photoresist 52 is then deposited and patterned to form a hole above the interior of the n-type layer 14. P-type ions, such as boron, are implanted to form the p-type layer 16. The second level of photoresist is removed. Ohmic contacts are then made to the semiconductor surface using methods familiar to those skilled in the art.

Figure 3A:
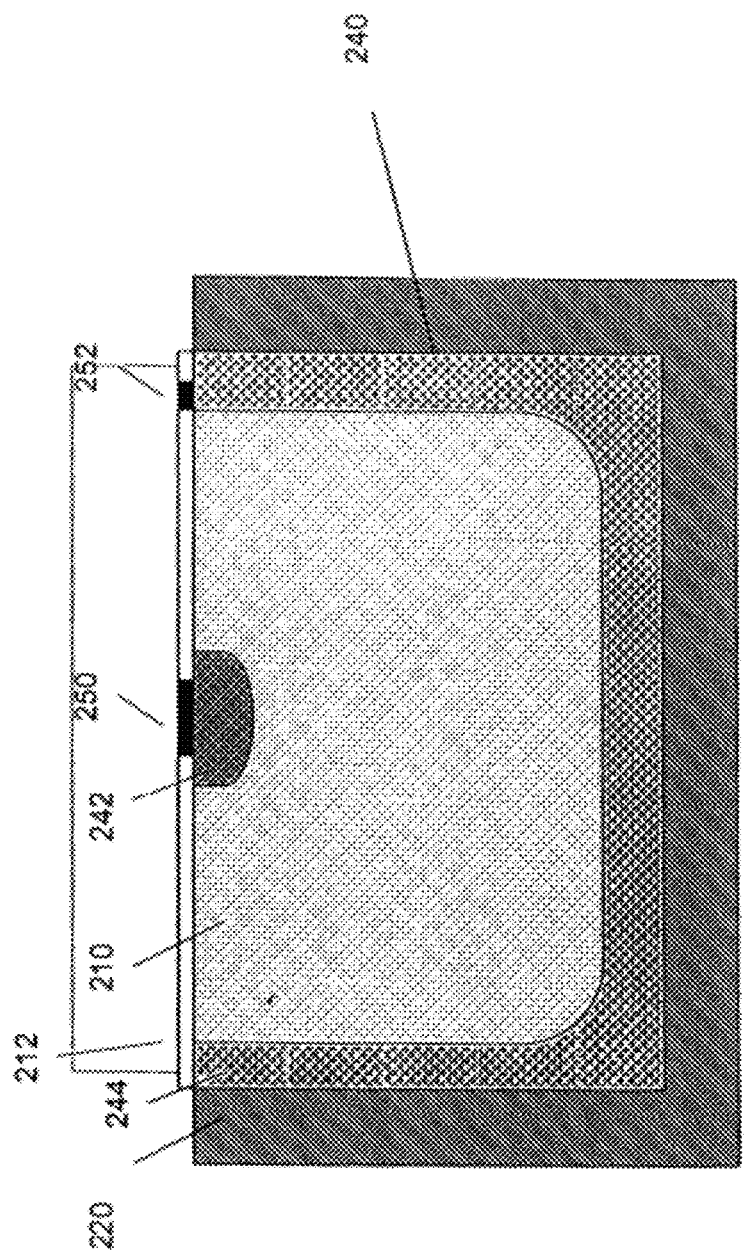

FIG. 3a (cross section) and FIG. 3b (plan view) show a second photodetector in accordance with the invention. The semiconductor body 210 is doped p-type, and a portion of the surface is passivated with a high-quality dielectric 212. An n-type layer 242 is created inside the body. Around the surface of body 210, a p-type layer 244 of heavy doping is created. The doping should be at least as high as the density of states in the material in order to suppress carrier generation around the dielectric/semiconductor interface 240. A contact 250 is made to the n-type layer and photocurrent is read out from this contact. A p-type contact 252 is formed to the p-type layer, and bias is applied so that the junction between the n-type and p-type regions is reverse-biased.

Figure 4A:
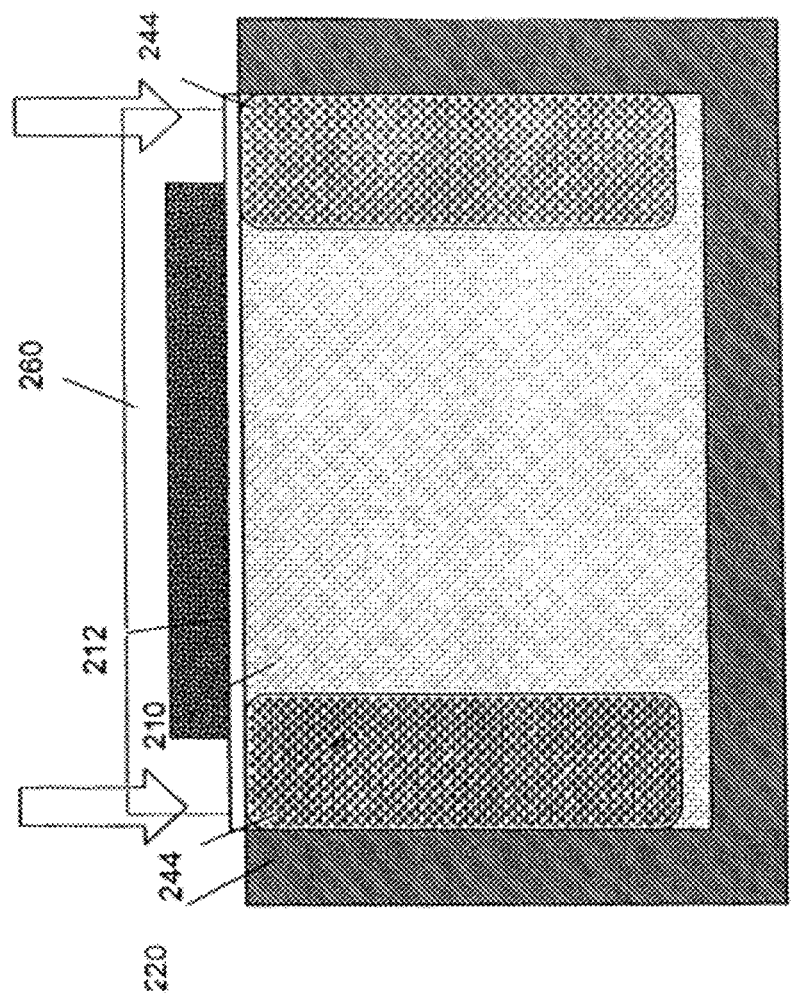
FIGS. 4a, 4b and 4c show an exemplary process sequence to create the photodetector of FIG. 3.
Figure 4B:
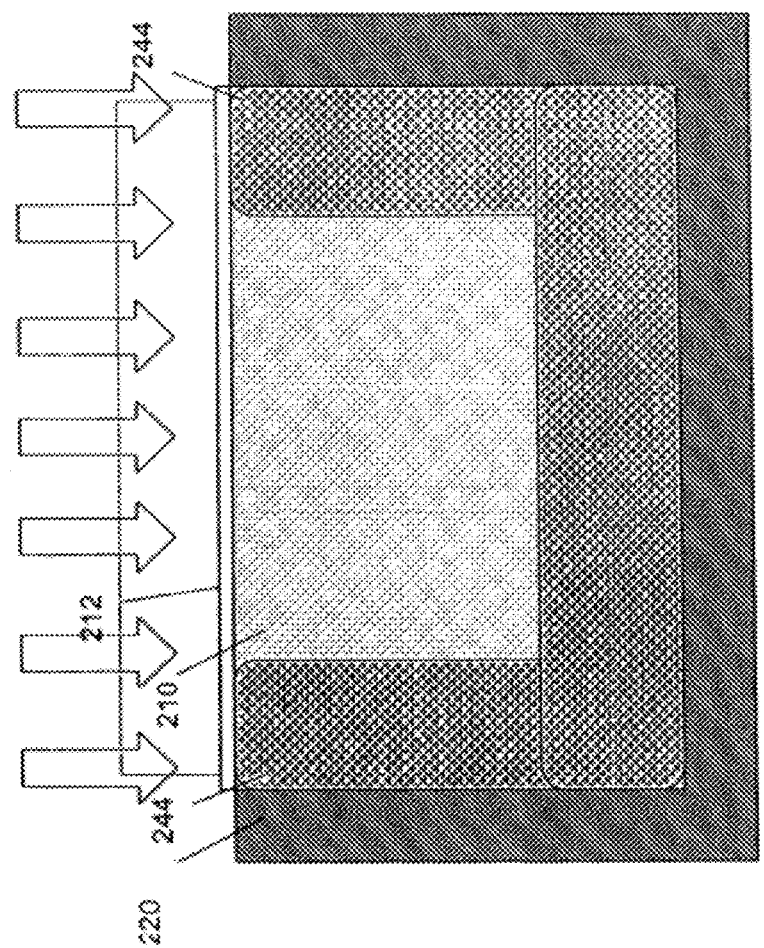
Figure 4C:
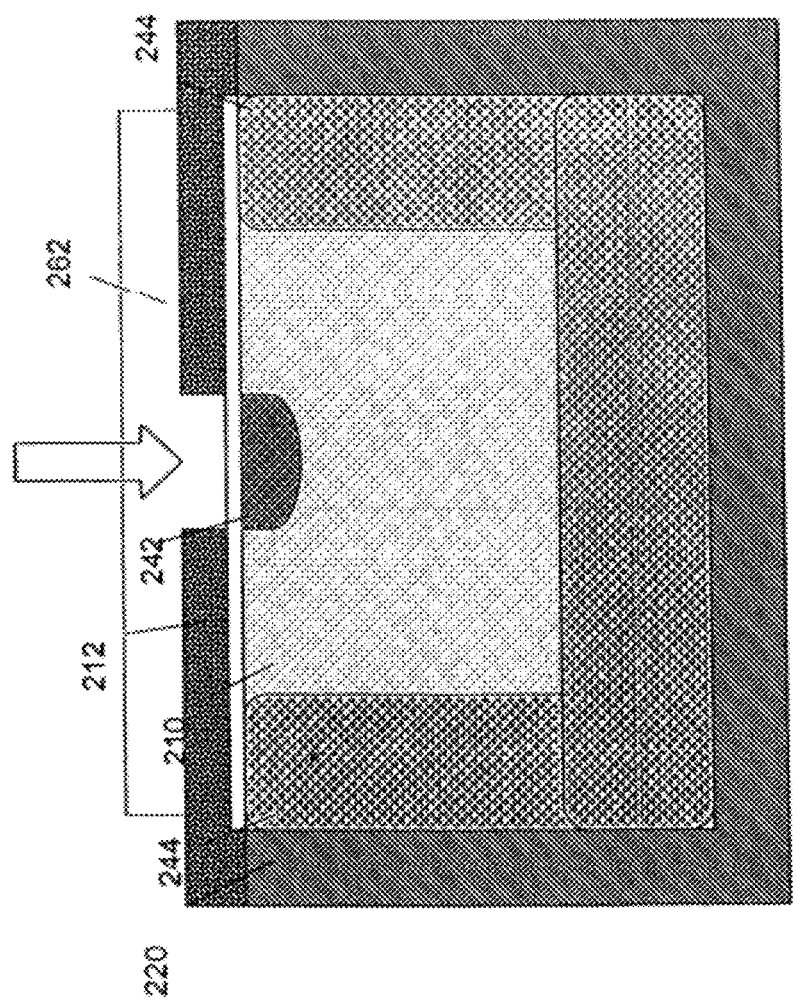

A process sequence to create the FIG. 3 device is illustrated by FIGS. 4a, 4b, and 4c. A crystalline semiconductor body 210 doped p-type is surrounded by dielectric material or materials 220. A passivation process is then applied to the exposed top surface of the semiconductor 210 to create a high-quality dielectric layer 212 (the passivation may take place after implantation to save a step). Such methods are known to those skilled in the state of the art. For the semiconductor germanium, a highly passivated surface can be created using germanium oxynitride, as demonstrated for example in reference [5]. A layer of photoresist 260 is deposited and patterned to protect most of the semiconductor region. Ion implantation is then carried out to create a high level of p-type doping 244 around the sides, and the photoresist is removed.

As shown in FIG. 4b, a second ion implantation is carried out with the energy adjusted so that the peak of the implant is close to the bottom of the doped layer. By this combination of implants, a continuous high level of doping is created around the semiconductor/dielectric interface 240. A second level of photoresist 262 is deposited (FIG. 4c) and patterned to create a hole inside the lightly doped body. An n-type layer 242 is formed by ion implantation to create the cathode of the diode. Metal contacts are formed to the n-type and p-type layers in the usual way.

Figure 5A:
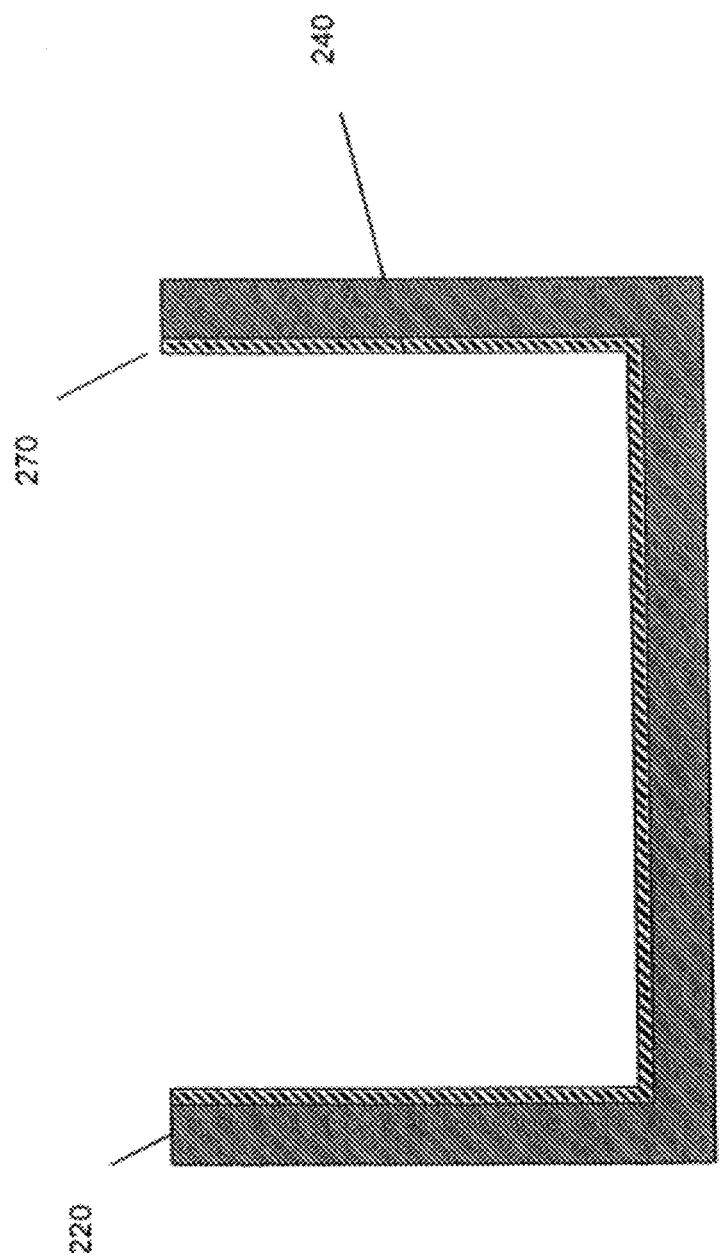
FIGS. 5a through 5e show an alternative process sequence to create the detector of FIG. 3.
Figure 5B:
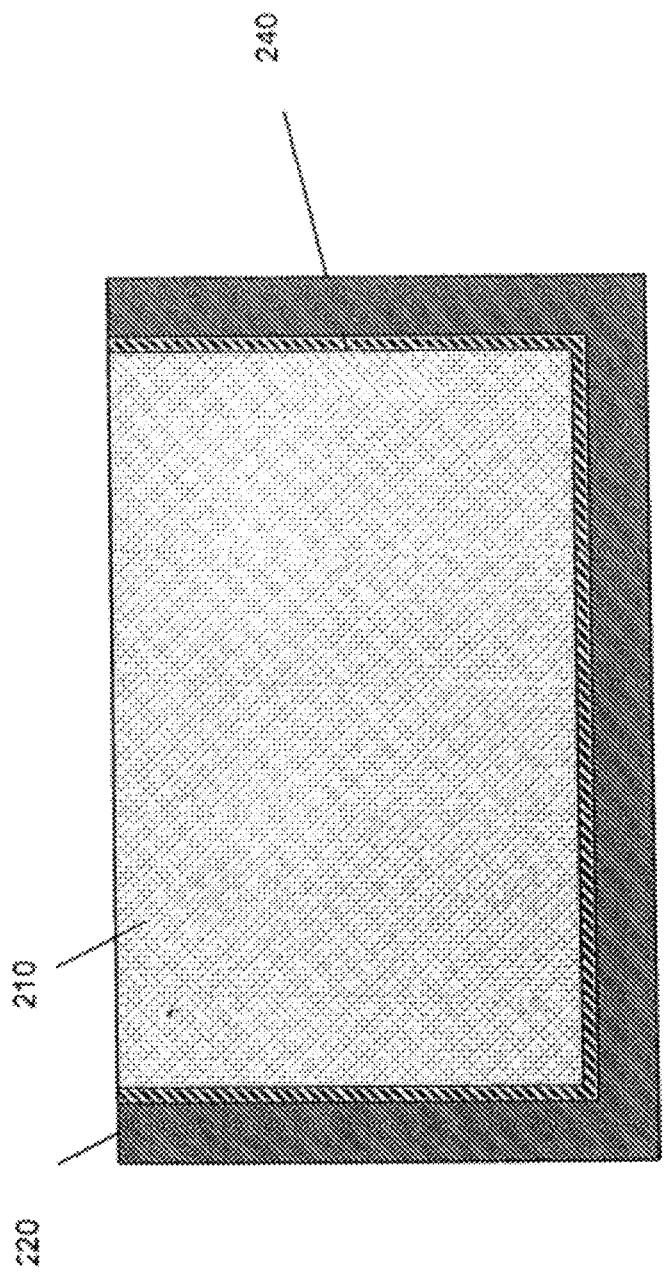
Figure 5C:
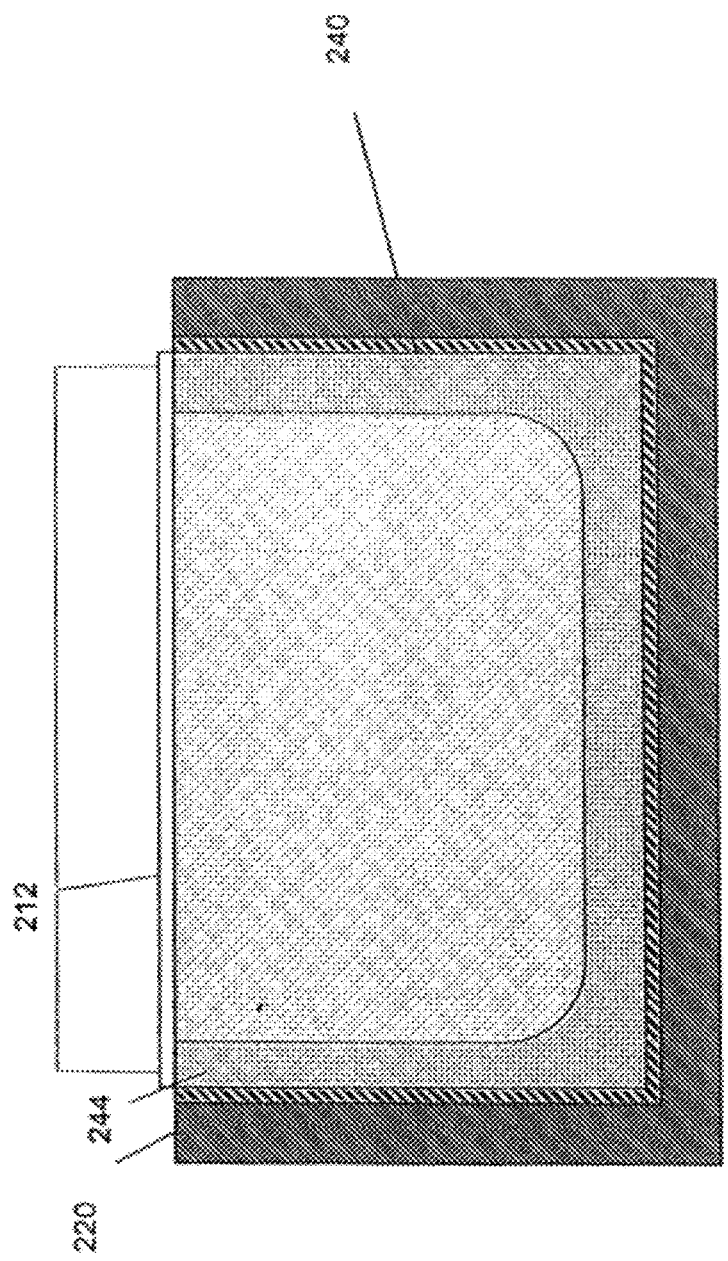
Figure 5D:
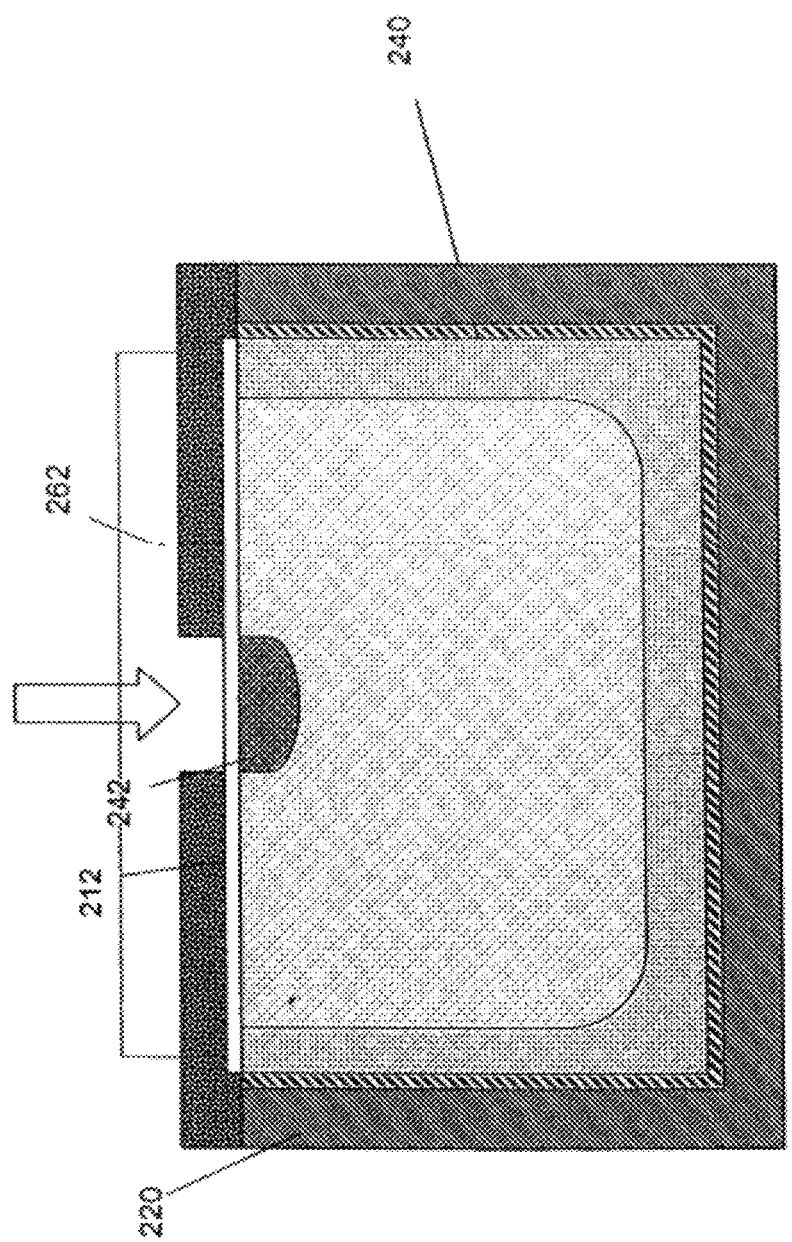
Figure 5E:
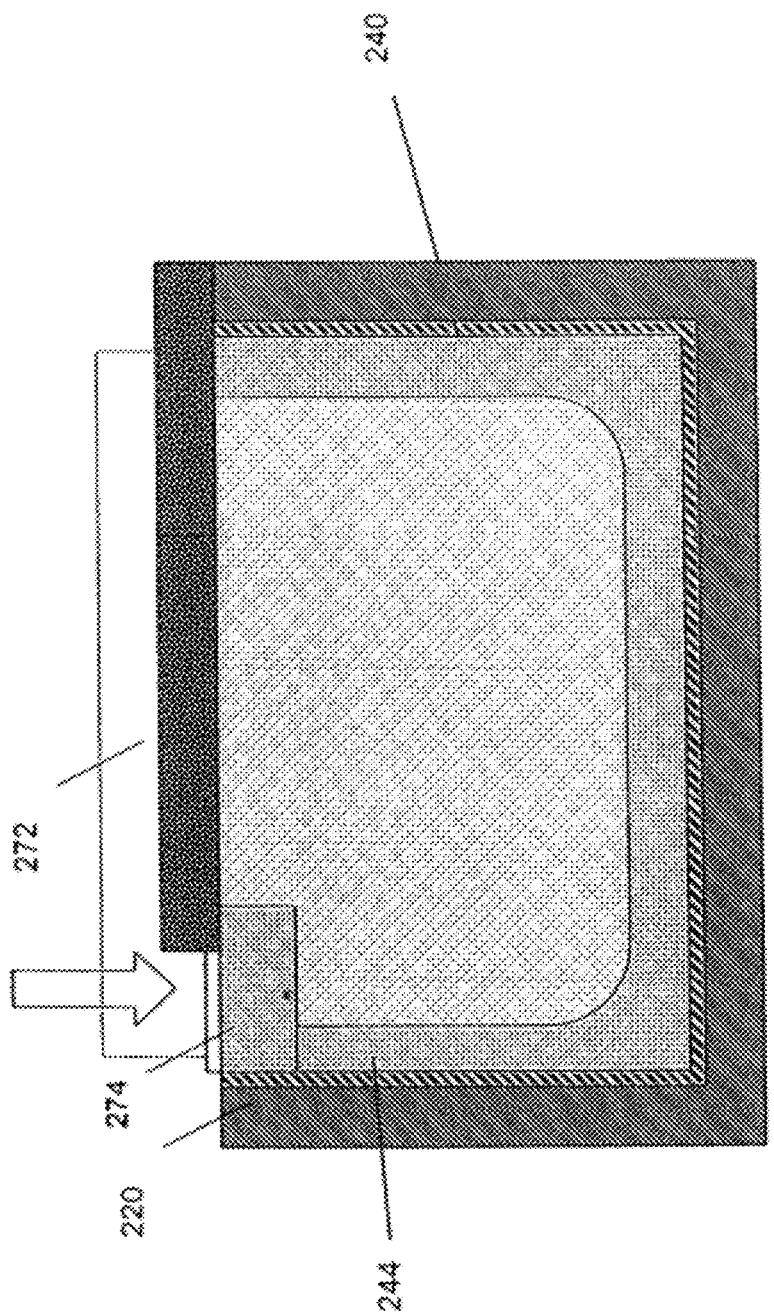

An alternative process sequence for this device is illustrated in FIGS. 5a-e. Before the semiconductor is grown to fill the cavity in the dielectric layer 220, a second dielectric layer 270 doped with a high level of boron is deposited to coat the inside of the dielectric cavity (FIG. 5a). The semiconductor body 210 is formed as before (FIG. 5b.) A high quality dielectric layer 212 is formed on the top surface of the semiconductor (FIG. 5c). During this or subsequent heat treatments, boron diffuses out of the surface of the dielectric 270 and enters the semiconductor 210, thus forming heavily boron doped region 244. The device is then masked with photoresist 262 and patterned with a hole above the semiconductor, and n-type dopants are implanted through the hole to form the n-type layer 242 (FIG. 5d). Contacts are created to the n-region and p-region in the usual manner.

If the surface doping layer 244 is not wide enough to allow a contact to be easily formed, a supplementary mask 272 and ion implantation (FIG. 5e) may be employed to create additional p-type doping 274 on the top surface, to which a contact may be made.

Although the device has been described as p-n, it should be appreciated that a corresponding n-p implementation is equally practical by appropriate choice of doping.

Figure 6A:
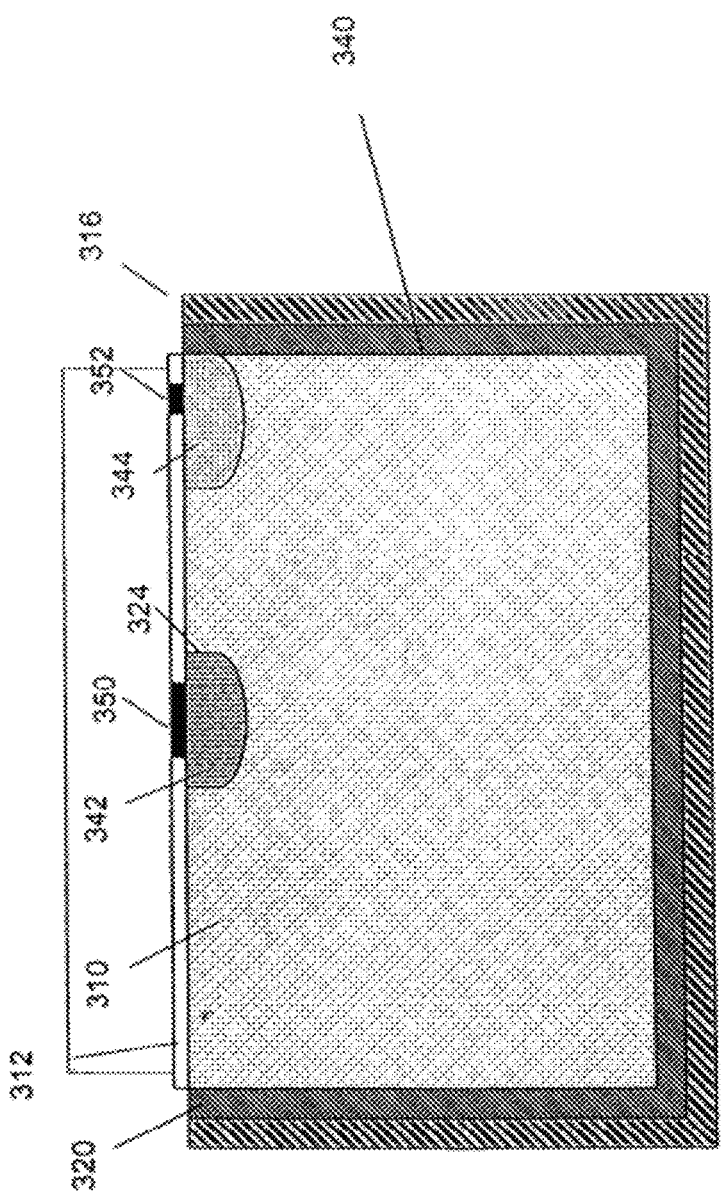
FIGS. 6a and 6b show a cross-section and plan view of a third low noise photodiode.
Figure 6B:
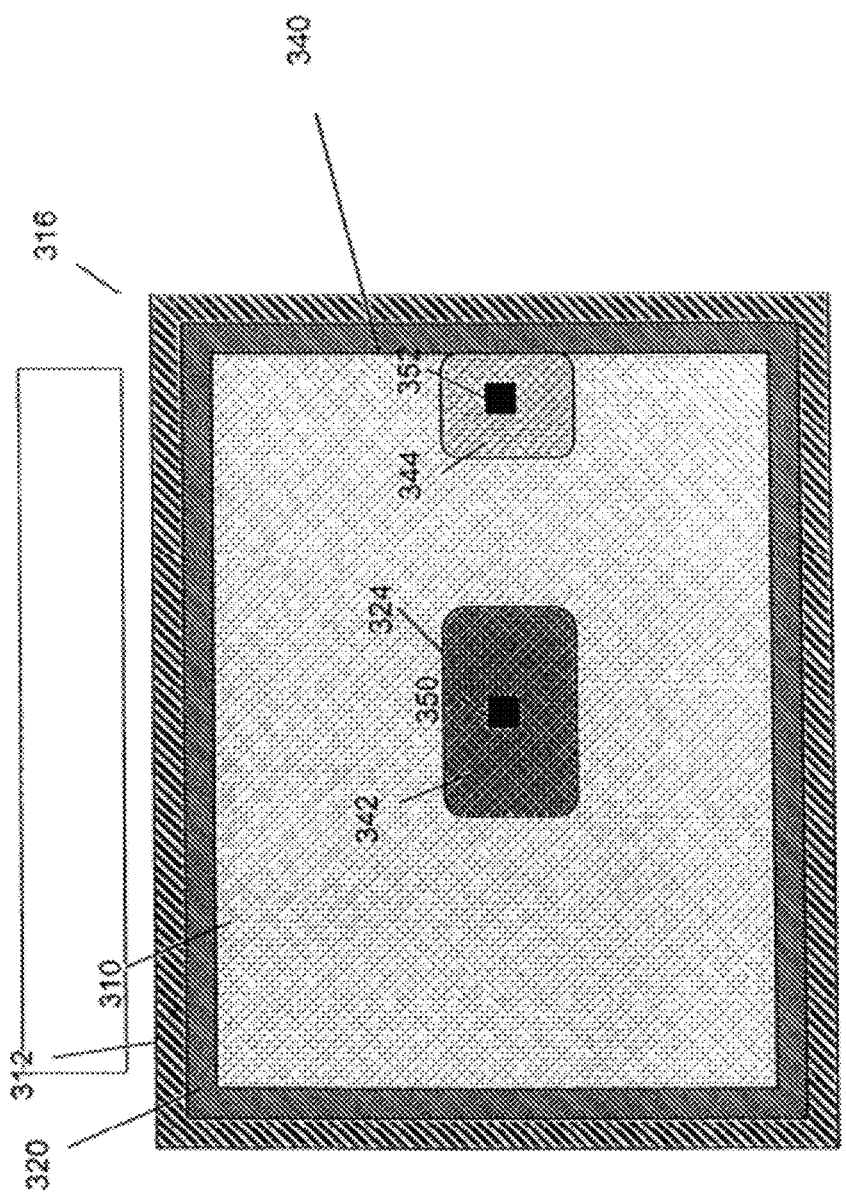

A third embodiment of a low noise photodetector is illustrated in FIGS. 6a, 6b. A crystalline semiconductor body 310 doped p-type is peripherally surrounded by low quality dielectric material or materials 320. A high-quality dielectric 312 with a low rate of generation and recombination passivates the top surface of the semiconductor body. Surrounding the outside of dielectric 320 is a polysilicon semiconductor 316 doped heavily with the same polarity as the body of the semiconductor body 310. By appropriate choice of the thickness of the dielectric layer 320, an accumulation layer of "holes" will be formed on the interface 340 between the crystalline semiconductor body 310 and the dielectric layer 320. An n-type area 342 is formed in the body, peripherally enclosed by the p-type layer and forming a junction 324 between the n-type and p-type layer. The p-type body 310 and the n-type area 342 should have a doping level high enough not to be depleted of mobile carriers. A highly doped p-type area 344 is formed so that it touches the accumulation layer at the interface 340. Ohmic metal contacts 350 352 are formed to the doped semiconductor layers 342 and 310, respectively.

Photocurrent is detected on the center contact 350, which is biased relative to contact 352 so that a reverse bias exists on the junction 324.

Figure 7A:
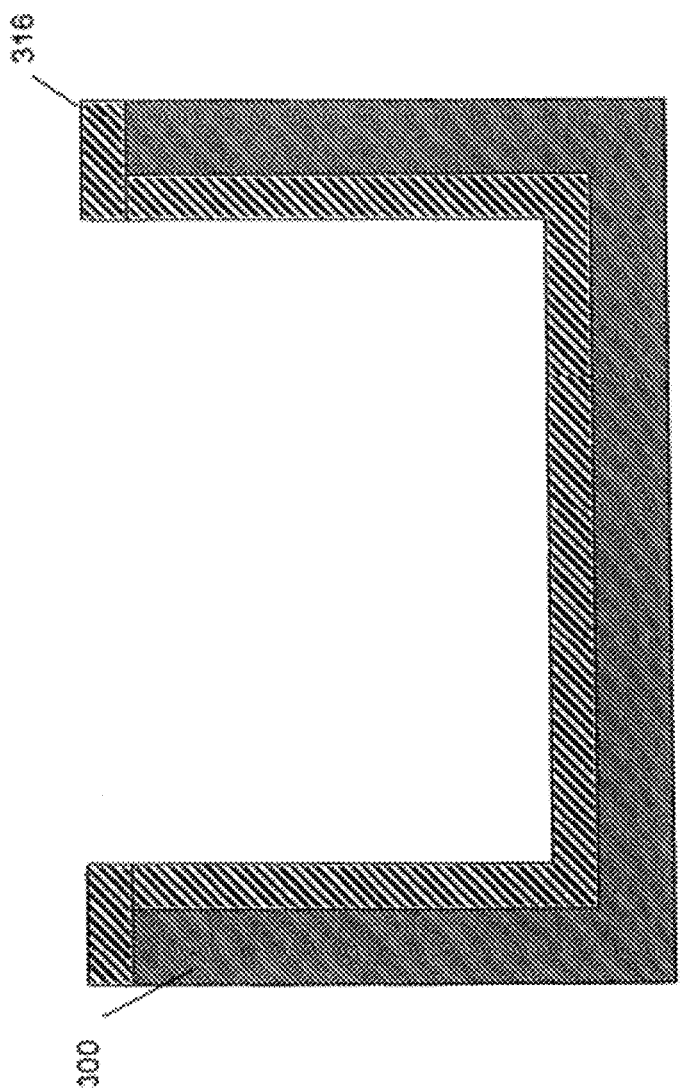
FIGS. 7a through 7g show a process sequence to create the detector of FIG. 6.
Figure 7B:
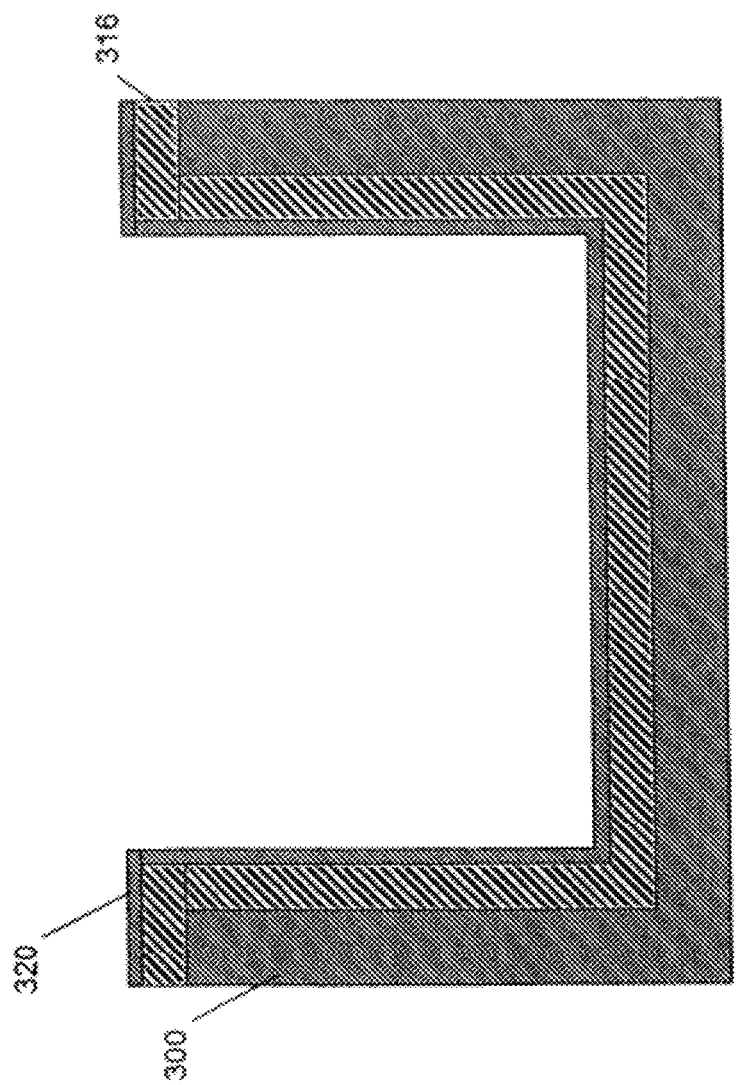
Figure 7C:
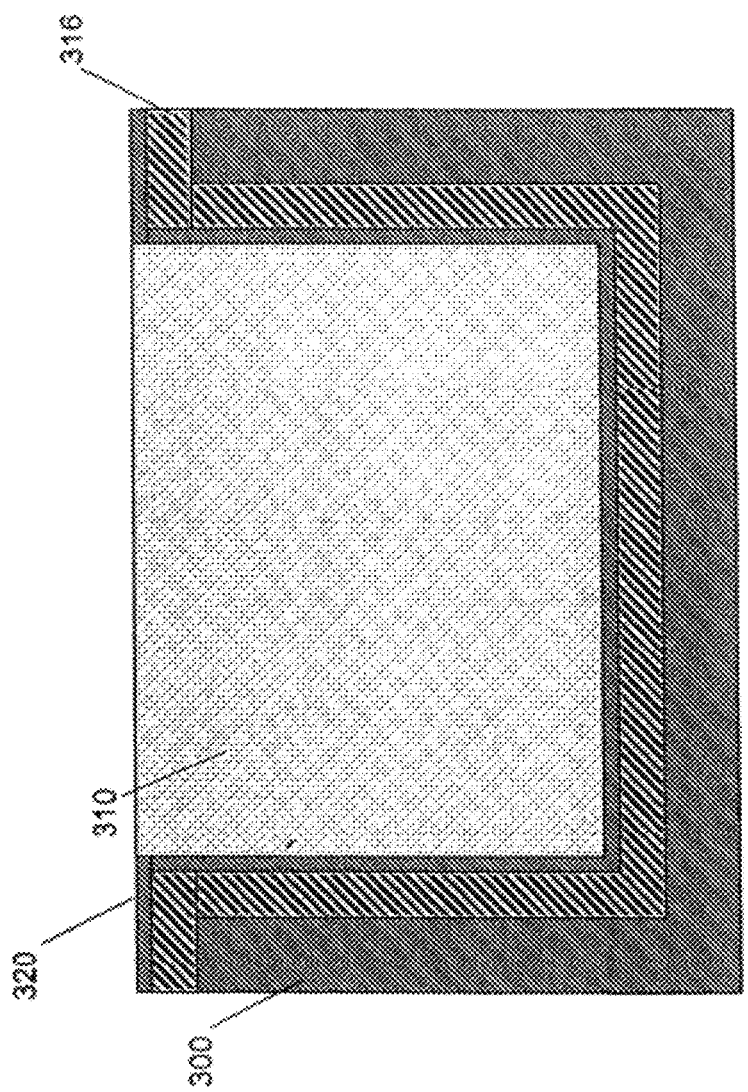
Figure 7D:
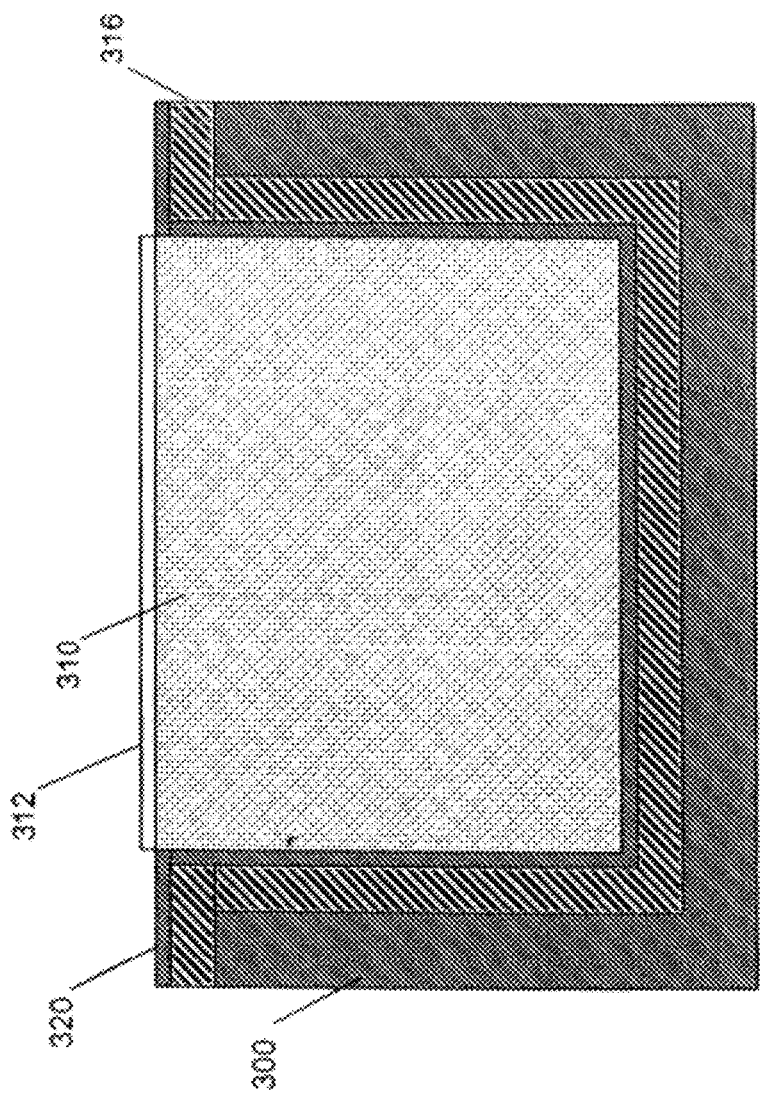
Figure 7E:
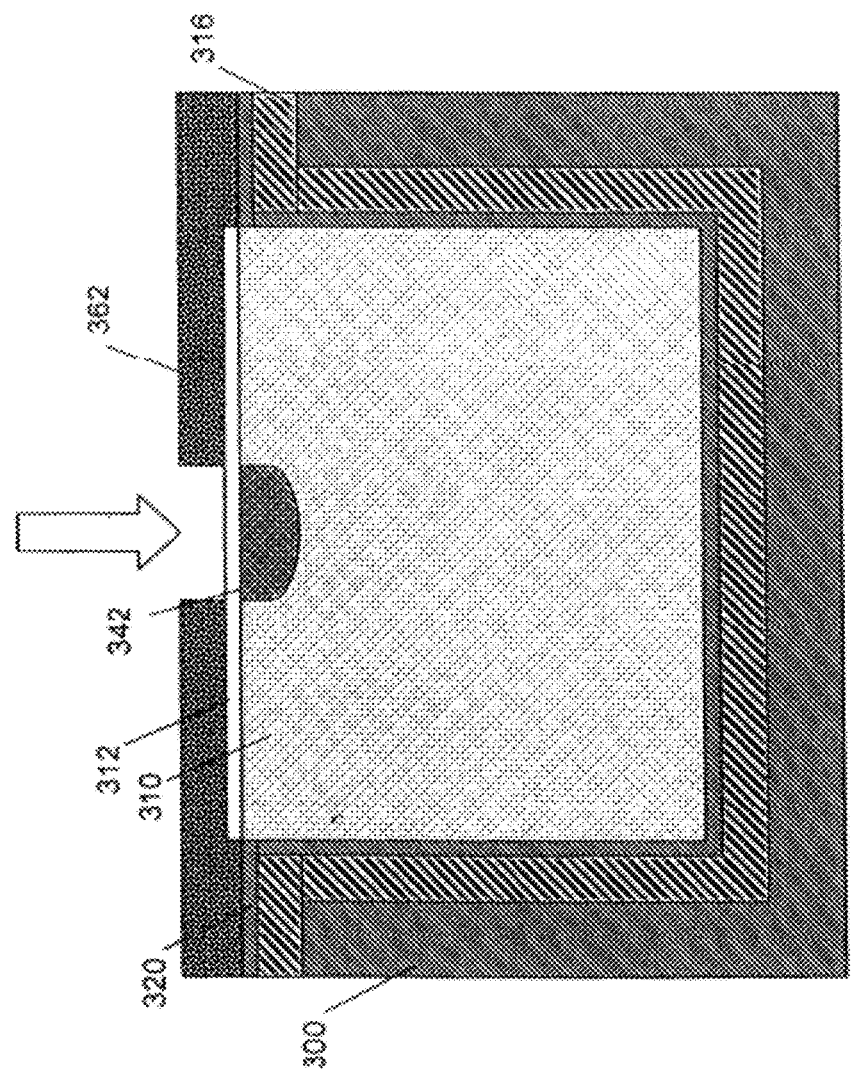
Figure 7F:
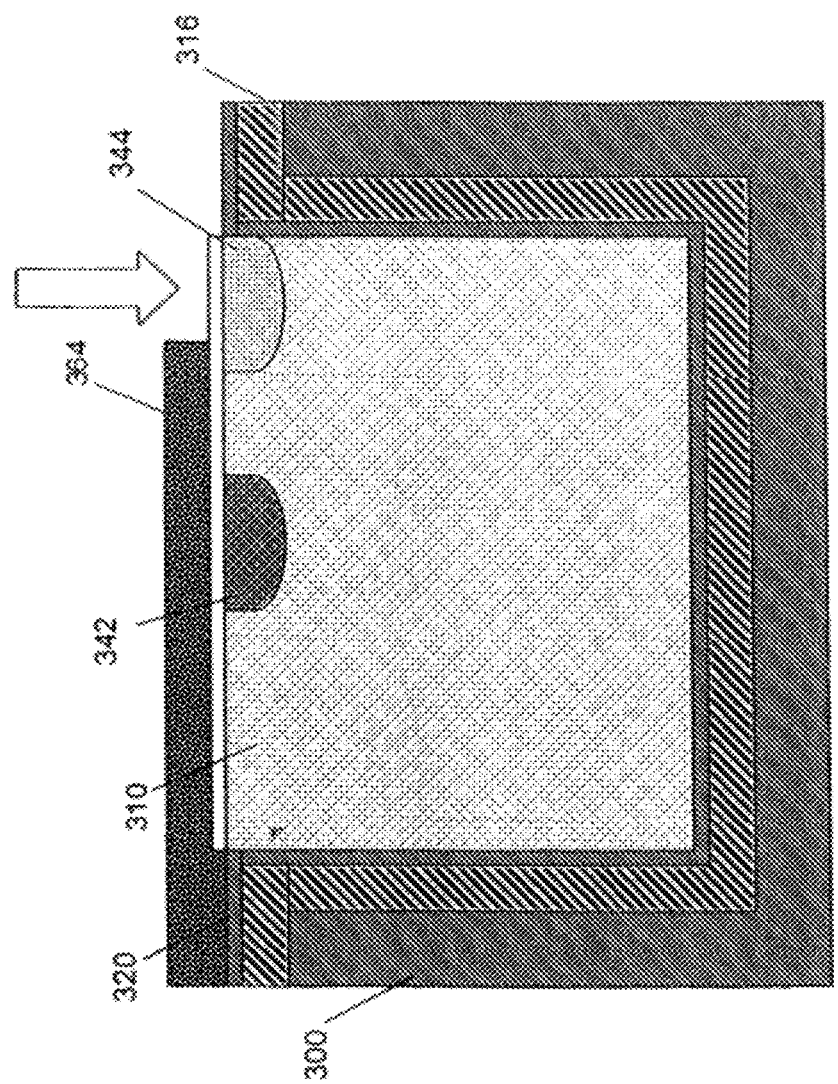
Figure 7G:
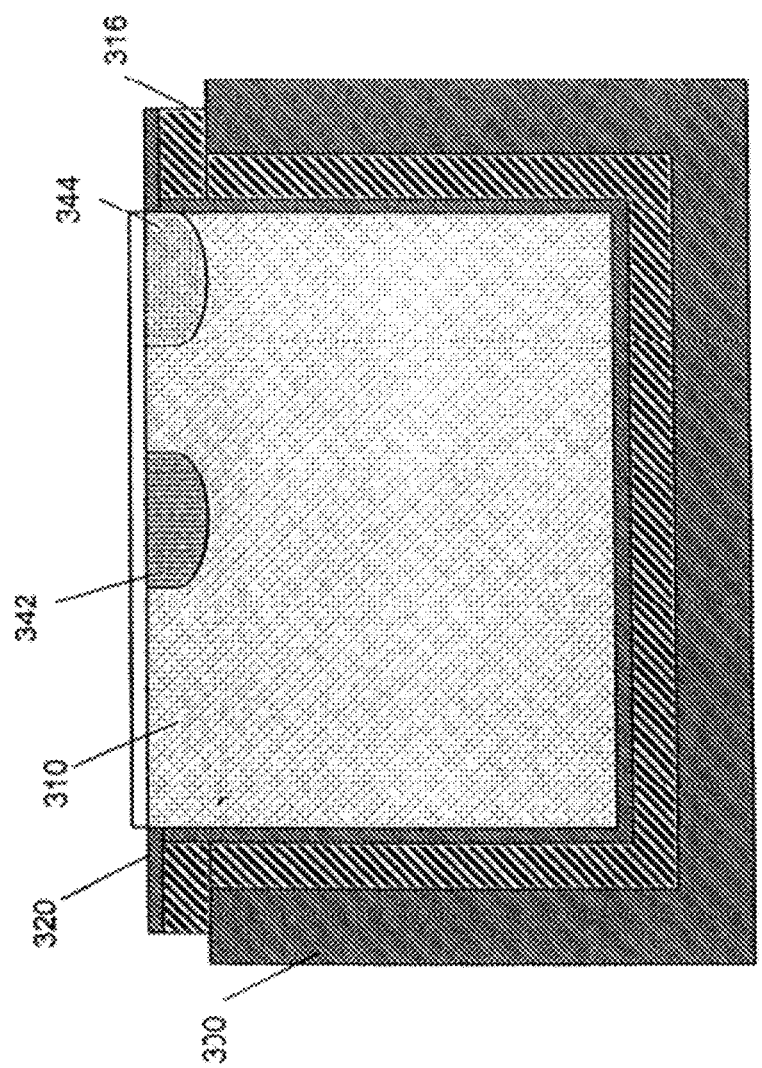

A process sequence for creating the detector of FIG. 6 is shown in FIGS. 7a-g. A prepared dielectric cavity 300 is coated with a polysilicon semiconductor layer 316. The layer may be doped as it is grown by in-situ doping, or it may be doped subsequently by exposure to appropriate gases or to ion implantation. A dielectric layer 320 is then deposited on the polysilicon semiconductor layer 316 (FIG. 7b). The thickness of the dielectric layer 320 is chosen to allow the field of the polysilicon doped layer to attract holes to the surface of the crystalline semiconductor which will be subsequently formed and to ensure that dielectric pinhole failures do not compromise the epitaxial growth of the semiconductor body 310. The thickness is preferably in the range 5-50 nm. The crystalline semiconductor body 310 is then formed, advantageously by the technique as disclosed in the aforementioned Ser. No. 10/453,037. A high-quality dielectric layer 312 is formed on the crystalline semiconductor body 310 as previously described (FIG. 7d). A resist mask 362 is deposited and patterned to form a hole above the body of the semiconductor 310 (FIG. 7e). N-type ions are implanted to form an n-type layer 342. The resist is removed. A resist mask 364 is deposited and patterned to form a hole adjoining the perimeter of the semiconductor 310. (FIG. 7f). P-type ions are implanted to form a p-type layer 344. The resist is removed. In FIG. 7e, the surface dielectric and the polysilicon are removed from the field. Contacts are formed to the n-type and p-type doped areas in the usual way.

Although the FIG. 6 embodiment has been described using an accumulation layer of holes, an inversion layer could also be created by doping the polysilicon layer 316 the opposite to the body 310. The doped area 344 should then also be n-type, and a separate contact to the p-type body 310 should be made on the top surface.

It will also be appreciated that the scope of the invention also includes a corresponding device similar to FIG. 6 with all the polarities reversed.

A further feature of the photodiodes described herein is can be seen by comparing FIG. 3b or FIG. 6b with the conventional photodiode of FIG. 8. In FIGS. 3b and 6b the annular doped region is contacted at only one point. This is an explicit design decision. In the conventional contacting scheme shown in FIG. 8 there are many contacts covering much of the area where light might otherwise enter the device. Conventional wisdom teaches that the annular region should be fully contacted by metal in order to minimize contact resistance. As many vias as possible should be sunk from the metal layer to the semiconductor layer, consistent with the via formation design rules. In contrast, applicants here have recognized that each contact contributes to the diffusion current of the diode, and that the number of contacts should in fact be minimized. At the low current levels at which most photodetectors operate, the contact resistance is unimportant. It is much more important to limit the dark current, which competes with the signal. Simulations show that reducing the number of contacts in a square detector from 28 to 4, with one at each corner, should reduce diffusion current by about a factor of 10. Reducing the number of contacts further, to just one, should lead to a further reduction in diffusion current. Therefore low-noise photodetectors of the type described herein advantageously have no more than 30% and preferably no more than about 25% of the available heavily doped area actually covered by contacts.

It is also possible to combine two or more of the approaches described in connection with FIGS. 1, 3 and 6 in a single device. For instance, one unpassivated face may be neutralized by the approach of FIG. 1 and the other unpassivated faces neutralized by the approach of FIG. 3, and so on.

Figure 9A:
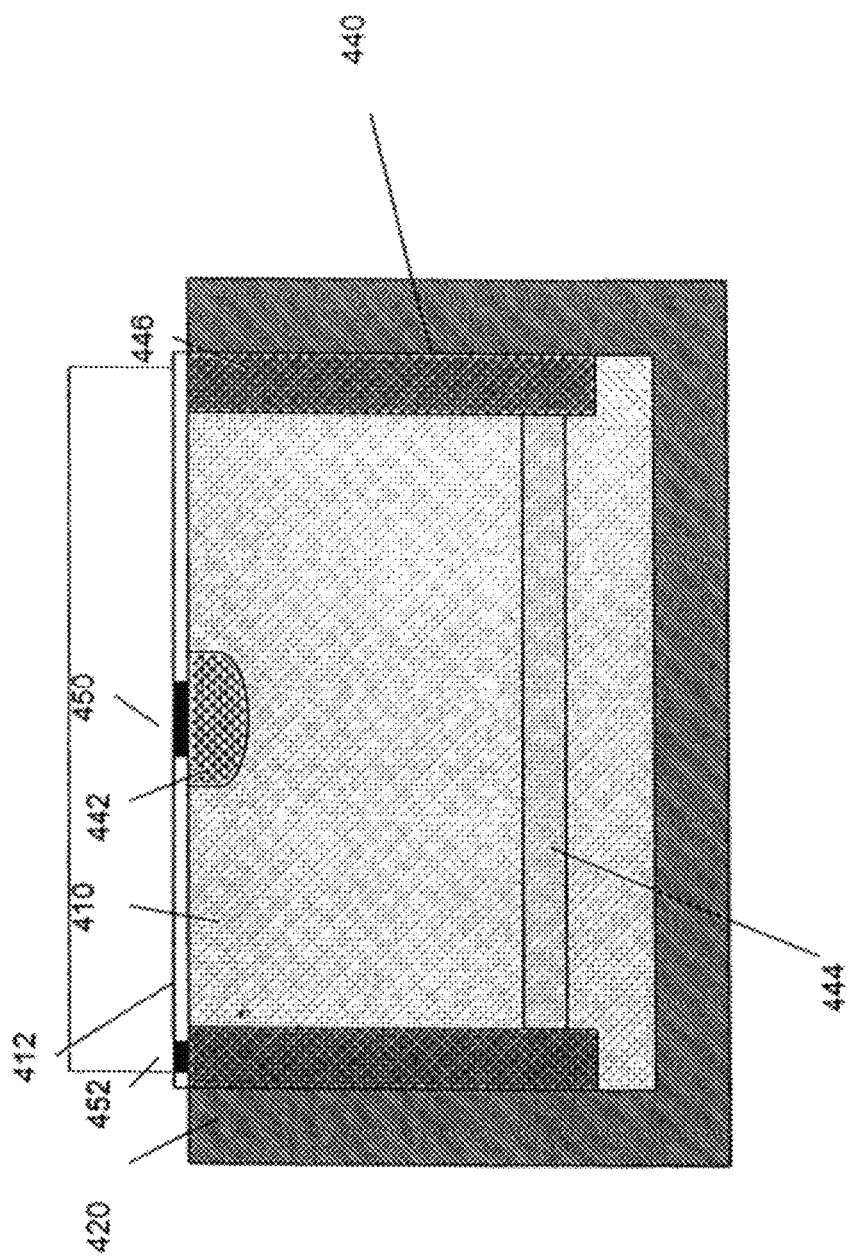
FIGS. 9A and 9B illustrate how different embodiments of the invention can be combined in a low noise photodetector.
Figure 9B:
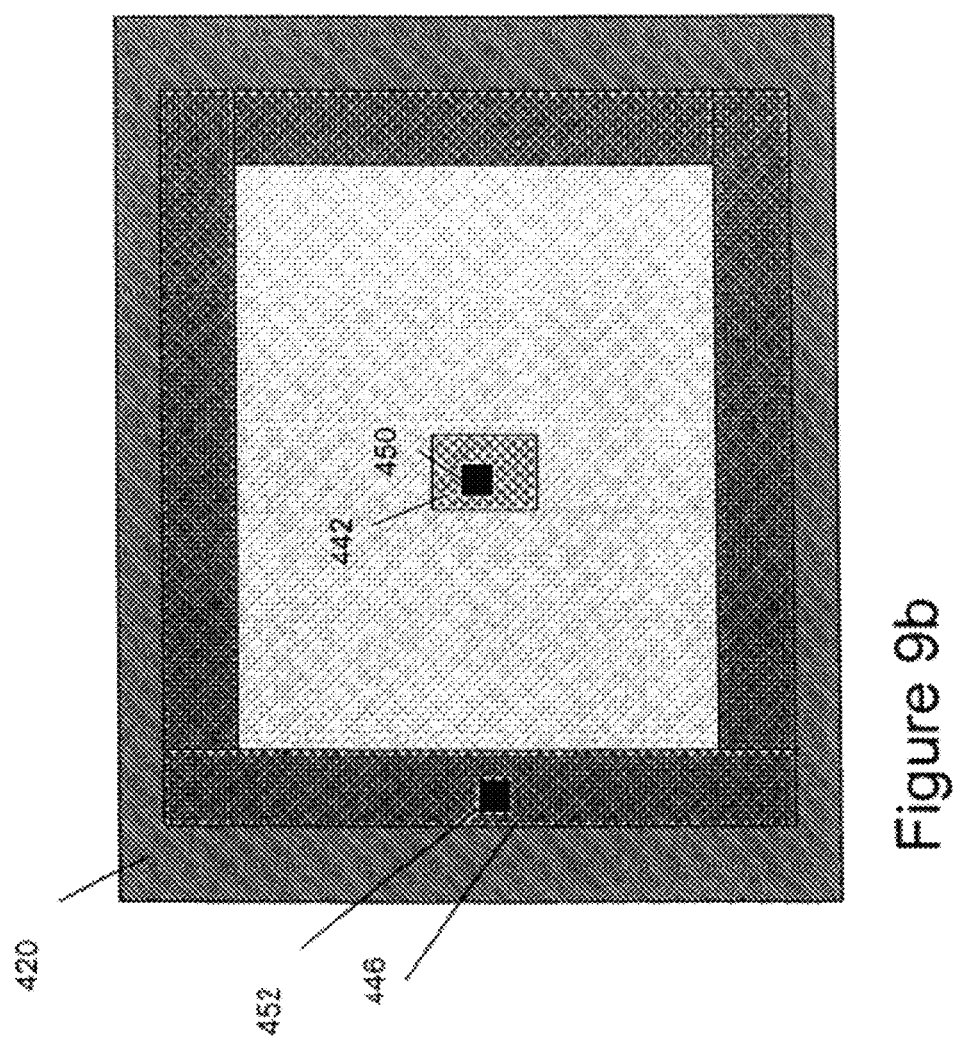

FIG. 9a (cross-section) and FIG. 9b (plan-view) exemplify such a combination. A semiconductor body 410 doped p-type has a passivating dielectric 412 on the top surface and unpassivating dielectrics 420 on the sides and bottom. A double junction is formed in the vertical direction, for instance by ion implantation, so that an n-type layer 444 separates the upper and low p halves of the device. Heavy n-type doping 446 is used to reduce the minority carrier density along the sidewalls 440. It also creates a conducting path 446 from the n-contact 452 to the buried n layer 444. Photocurrent is read on contact 450. The bottom p section of the well can be contacted from below. The device combines the double junction technique to neutralize the bottom and the heavy doping technique to neutralize the sidewalls.

It can now be seen that one aspect of the invention is a low noise photodetector comprising a body of semiconductor material. The body has a surface substantially surrounded by dielectric material and comprising a first portion that is passivated and a second portion that is unpassivated. The body also comprises a first region doped to a first type of conductivity (p or n) and a second region doped to the second type of conductivity (n or p), the two regions forming a first p-n junction.

The first p-n junction intersects the surface of the body in an intersection region that is within the passivated portion of the body surface, and the device is adapted to minimize leakage current from the unpassivated second portion of the body surface by one or more of the following:
1) the body includes a third doped region to form a second p-n junction in the path between the unpassivated surface (or a part thereof) and the first region, the second p-n junction having a polarity opposite the first junction,
2) the region of the semiconductor body that is adjacent the unpassivated surface portion is highly doped to suppress carrier generation at the unpassivated surface, and
3) a highly doped semiconductor is disposed around and in contact with the dielectric adjacent the unpassivated portion of the semiconductor surface to form an accumulation layer or an inversion layer on the unpassivated surface.

While the above description contains many specific examples, these should not be construed as limitations on the scope of the invention, but rather as examples of several preferred embodiments. Accordingly, the scope of the invention should be determined not by the embodiments illustrated, but by the appended claims and their legal equivalents.

APPENDIX OF REFERENCES

[1] G. Masini, L. Colace, G. Assanto, H.-C. Luan, and L. C. Kimmerling, "Highperformance p-i-n Ge on Si photodetectors for near infrared, from model to demonstration," IEEE Trans. Electron Devices, vol. 48, no. 6, pp. 1092, 2001.
[2] J. Oh, J. C. Campbell, S. G. Thomas, B. Bharatan, R. Thoma, C. Jasper, R. E. Jones, and T. E. Zirkle, "Interdigitated Ge p-i-n photodetectors fabricated on a Si substrate using graded SiGe buffer layers," IEEE Journal of Quantum Electronics, vol. 38, no. 9, pp. 1238, 2002.
[3] GPD Germanium Photodetector Data sheet, device GMB-VHR
[4] Judson Technologies Germanium Photodetector Data sheet PB 1600
[5] H. Shang, H. Okorn-Schmidt, K. K. Chan, M. Copel, J. Ott, P. M. Kozlowski, S. E. Steen, S. A. Cordes, H.-S. P. Wong, E. C. Jones, and W. E. Haensch, "High mobility p-channel Ge MOSFET's with a thin Ge oxynitride gate dielectric," in IEDM Tech. Digest, 2002, pp. 441-444.

The invention claimed is:
1. A method of detecting light, comprising:
using a semiconductor structure as a photodetector to detect incident light and generate an electrical signal representative of the detected incident light, the semiconductor structure comprising:
a body of semiconductor material having a surface comprising a first portion and a second portion;
a layer of a first dielectric material being configured to contact the first portion of the surface of the body of semiconductor material;
a second dielectric material contacting the second portion of the surface of the body of semiconductor material and configured to passivate the second portion;
wherein the body of semiconductor material comprises:
a first region doped to a first type of conductivity (p or n); and
a second region peripherally around the first region doped to a second type of conductivity (n or p) opposite the first type of conductivity, the second region forming a p-n junction with the first region, the p-n junction intersecting the surface of the body of semiconductor material at the second portion of the surface;
a plurality of ohmic contacts comprising a first ohmic contact to the first region and a second ohmic contact to the second region; and
a highly doped semiconductor material substantially surrounding the layer of the first dielectric material,
wherein the layer of the first dielectric material has a thickness configured to cause formation of an accumulation layer or an inversion layer at the first portion of the surface of the body of semiconductor material.
2. The method of claim 1, wherein the highly doped semiconductor material substantially surrounding the layer of the first dielectric material is doped to the second type of conductivity, and wherein the thickness of the layer of the first dielectric material is configured to cause formation of an accumulation layer at the first portion of the surface of the body of semiconductor material.
3. The method of claim 2, wherein the second region of the body of semiconductor material comprises a contact region doped to the second type of conductivity and configured to contact the accumulation layer, and wherein the second ohmic contact to the second region contacts the contact region of the second region.
4. The method of claim 1, wherein the highly doped semiconductor material substantially surrounding the layer of the first dielectric material is doped to the first type of conductivity, and wherein the thickness of the layer of the first dielectric material is configured to cause formation of an inversion layer at the first portion of the surface of the body of semiconductor material.
5. The method of claim 1, wherein the body of semiconductor material comprises germanium.
6. The method of claim 5, wherein the body of semiconductor material comprises at least 80% germanium.
7. A method of detecting light, comprising:
using a semiconductor structure as a photodetector to detect incident light on a light receiving surface of the semiconductor structure and generate an electrical sig- nal representative of the detected incident light, the semiconductor structure comprising:
a body of semiconductor material comprising:
an outer region doped to a first type of conductivity (p or n);
an inner region doped to a second type of conductivity (n or p) opposite the first type of conductivity;
a contact region in contact with the outer region, the contact region being highly doped to the first type of conductivity and comprising an exposed surface; and
a p-n junction formed between the outer region and the inner region; and
a plurality of metal contacts comprising a first metal contact to the contact region and a second metal contact to the inner region, the first metal contact and second metal contact being substantially co-planar within a plane substantially parallel to the light receiving surface of the semiconductor structure;
wherein less than approximately 30% of the exposed surface of the contact region is covered by metal contacts.

8. The method of claim 7, wherein less than approximately 25% of the exposed surface of the contact region is covered by metal contacts.

9. The method of claim 7, wherein the body of semiconductor material comprises germanium.

10. The method of claim 9, wherein the body of semiconductor material comprises at least 80% germanium.

* * * * *